(12) United States Patent
Markhart

(10) Patent No.: US 6,998,218 B2
(45) Date of Patent: Feb. 14, 2006

(54) APPARATUS AND METHOD FOR THERMALLY DEVELOPING FLEXOGRAPHIC PRINTING SLEEVES

(76) Inventor: Gary T. Markhart, 2904 Corte Celeste, Carlsbad, CA (US) 92009

( * ) Notice: Subject to any disclaimer, the term of this patent is extended or adjusted under 35 U.S.C. 154(b) by 30 days.

(21) Appl. No.: 10/811,763

(22) Filed: Mar. 29, 2004

(65) Prior Publication Data

US 2005/0211119 A1 Sep. 29, 2005

(51) Int. Cl.
*G03F 7/34* (2006.01)

(52) U.S. Cl. .................. 430/306; 101/395; 399/345; 399/350; 399/352; 399/357; 399/358

(58) Field of Classification Search ............... None
See application file for complete search history.

(56) References Cited

U.S. PATENT DOCUMENTS

| | | | |
|---|---|---|---|
| 3,264,103 A * | 8/1966 | Cohen et al. ............... 430/254 |
| 4,777,509 A | 10/1988 | Komatsubara et al. |
| 5,107,764 A * | 4/1992 | Gasparrini .................. 101/425 |
| 5,175,072 A | 12/1992 | Martens |
| 5,279,697 A * | 1/1994 | Peterson et al. ............ 156/358 |
| 5,666,617 A | 9/1997 | Goodman et al. |
| 5,717,985 A | 2/1998 | Labombard et al. |
| 5,798,019 A | 8/1998 | Cushner et al. |
| 5,925,500 A | 7/1999 | Yang et al. |
| 5,987,284 A | 11/1999 | Lewis |
| 6,006,059 A | 12/1999 | Till et al. |
| 6,490,424 B1 * | 12/2002 | Okamoto .................... 399/101 |
| 6,496,676 B1 | 12/2002 | Caruthers, Jr. et al. |
| 6,797,454 B1 | 9/2004 | Johnson et al. |
| 2003/0180655 A1 | 9/2003 | Fan et al. |
| 2003/0211423 A1 | 11/2003 | Mengel et al. |

FOREIGN PATENT DOCUMENTS

| | | |
|---|---|---|
| EP | 1 239 329 A2 | 9/2002 |
| WO | WO 01/18604 A2 | 3/2001 |
| WO | WO 01/88615 A1 | 11/2001 |

* cited by examiner

*Primary Examiner*—David M. Gray
*Assistant Examiner*—Joshua Zimmerman
(74) *Attorney, Agent, or Firm*—Carmody & Torrance LLP

(57) ABSTRACT

An improved thermal development apparatus is used to remove uncured photopolymer from the imaged surface of a flexographic printing element. The apparatus typically comprises one or more heatable rolls that are contactable with an imaged surface of a flexographic printing element; and means for maintaining contact between the one or more heatable rolls and the imaged surface of the flexographic printing element. The one or more heatable rolls are heated and is moved over at least a portion of the imaged surface of the flexographic printing element, and non-crosslinked polymer on the imaged surface of the flexographic printing element is melted and removed by the one or more heatable rolls.

37 Claims, 3 Drawing Sheets

APPARATUS AND METHOD FOR THERMALLY DEVELOPING FLEXOGRAPHIC PRINTING SLEEVES

FIELD OF THE INVENTION

The present invention is directed to a method and apparatus for thermally developing flexographic printing elements, including printing plates and printing sleeves, which have previously been imaged and/or exposed.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset on print quality.

A typical flexographic printing plate as delivered by its manufacturer, is a multilayered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

It is highly desirable in the flexographic prepress printing industry to eliminate the need for chemical processing of printing elements in developing relief images, in order to go from plate to press more quickly. Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. U.S. 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for use of the process in the manufacture of flexographic plates for printing newspapers and other publications where quick turnaround times and high productivity are important.

The photopolymer layer allows for the creation of the desired image and provides a printing surface. The photopolymers used generally contain binders, monomers, photoinitiators, and other performance additives. Photopolymer compositions useful in the practice of this invention include those described in U.S. patent application Ser. No. 10/353,446 filed Jan. 29, 2003, the teachings of which are incorporated herein by reference in their entirety. Various photopolymers such as those based on polystyrene-isoprene-styrene, polystyrene-butadiene-styrene, polyurethanes and/or thiolenes as binders are useful. Preferable binders are polystyrene-isoprene-styrene, and polystyrene-butadiene-styrene, especially block co-polymers of the foregoing.

The composition of the photopolymer should be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) will melt or substantially soften while the cured photopolymer will remain solid and intact at the temperature chosen. Thus the difference in melt temperature allows the uncured photopolymer to be selectively removed thereby creating an image.

The printing element is selectively exposed to actinic radiation. Selective exposure is generally accomplished in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer, which is also sensitive to laser ablation. A laser is then used to ablate selected areas of the actinic radiation opaque layer creating an in situ negative. The printing element is then flood exposed through the in situ negative. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Once the photopolymer layer of the printing element has been selectively exposed to actinic radiation, it is then ready to develop using heat. As such, the printing element is generally heated to at least about 70° C. The exact temperature will depend upon the properties of the particular photopolymer being used. However, two primary factors should be considered in determining the development temperature:

1. The development temperature is preferably set between the melt temperature of the uncured photopolymer on the low end and the melt temperature of the cured photopolymer on the upper end. This will allow selective removal of the photopolymer thereby creating the image.
2. The higher the development temperature, the quicker the process time will be. However, the development temperature should not be so high as to exceed the melt temperature of the cured photopolymer or so high that it will degrade the cured photopolymer. The temperature should be sufficient to melt or substantially soften the uncured photopolymer thereby allowing it to be removed.

Once the heated printing element has been developed, uncured photopolymer can be melted or removed. In most instances, the heated printing element is contacted with a material that will absorb or otherwise remove the softened or melted uncured photopolymer. This removal process is generally referred to as "blotting". Blotting is typically accomplished using a screen mesh or an absorbent fabric. Either woven or non-woven fabric is used and the fabric can be polymer based or paper, so long as the fabric can withstand the operating temperatures involved. In most instances, blotting is accomplished using rollers to bring the material and the heated printing plate element into contact.

U.S. Pat. No. 5,175,072 to Martens, the subject matter of which is herein incorporated by reference in its entirety, describes the removal of uncured portions of the photopolymer by using an absorbent sheet material. The uncured photopolymer layer is heated by conduction, convection, or other heating method to a temperature sufficient to effect melting. By maintaining more or less intimate contact of the absorbent sheet material with the photocurable layer, a transfer of the uncured photopolymer from the photopolymer layer to the absorbent sheet material takes place. While still in the heated condition, the absorbent sheet material is separated from the cured photopolymer layer in contact with the support layer to reveal the relief structure. After cooling, the resulting flexographic printing plate can be mounted on a printing plate cylinder.

Upon completion of the blotting process, the printing plate element is preferably post-exposed to further actinic radiation, cooled and then ready for use.

Depending upon the particular application, the printing element may also comprise other optional components. For instance, it is frequently preferable to use a removable coversheet over the photopolymer layer to protect the layer during handling. If used, the coversheet is removed either just before or just after the selective exposure to actinic radiation. Other layers such as slip layer or masking layers as described in U.S. Pat. No. 5,925,500 to Yang et al., the teachings of which are incorporated herein by reference in their entirety, can also be used.

The drawback to many of the current methods of thermal development is that these methods can be used only on flat plates, which must then be mounted after development. This operation requires an additional machine and more time and can also result in a loss in accuracy when registration between multiple plates and colors is required.

Current thermal development apparatuses using heated rolls for blotting away the uncured photopolymer typically use only one heated roll that is of approximately the same width as the plate. This increases the difficulty in making printing elements of different sizes. In addition, additional problems may arise when attempting to make the blotting machine larger.

Another problem with the current blotting methods is that a tremendous amount of force (approximately 100 pounds/linear inch) must be applied by the heated roll to force the blotting material into the image on the printing element. This large force can cause the heated roll to bend, resulting in an uneven floor. Furthermore, the heating and blotting process must often be repeated several times in order to obtain effective removal of the uncured photopolymer.

While various thermal development apparatuses have been developed for use in the production of relief image printing plates, there remains a need in the art for a thermal developing device that can be used with cylindrical printing elements, either as continuous printing sleeves or as plates that are then formed into printing sleeves. Furthermore, there remains a need in the art for a thermal developing device that can easily be used to produce different sized printing elements.

SUMMARY OF THE INVENTION

The present invention comprises an improved thermal development apparatus and a method of using the improved thermal development apparatus to remove uncured photopolymer from the imaged surface of a flexographic printing element.

The improved thermal development apparatus of the invention typically comprises:

(i) means to support, and preferably rotate, a flexographic printing element;

(ii) at least one heatable roll that is contactable with an imaged surface of a flexographic printing element;

(iii) means for maintaining contact between the at least one heatable roll and the imaged surface of the flexographic printing element, and (iv) optionally, but preferably, means to supply a material which is capable of removing the softened or melted polymer from the flexographic printing element;

wherein when the at least one heatable roll is heated and is moved over at least a portion of the imaged surface of the flexographic printing element, non-crosslinked polymer on the imaged surface of the flexographic printing element is melted or softened and removed by the at least one heatable roll, and wherein the flexographic printing element preferably comprises a cylindrical printing sleeve.

In a preferred embodiment, two heatable rolls are used, such that the two heatable rolls are self-centering against the imaged surface of the cylindrical printing element.

The heatable roll(s) preferably have a blotting material positioned around at least the portion of the heatable roll(s) in contact with the imaged surface of the flexographic printing element. In an alternate embodiment, a doctor blade can be positioned adjacent to the heatable roll(s) to remove non-crosslinked photopolymer from the heatable roll(s) after it has been removed from the imaged surface of the flexographic printing element.

In another preferred embodiment, one or more additional heatable rolls may be positioned in an opposing position on the opposite side of the cylindrical printing element to increase resin removal from the imaged surface of the flexographic printing element and to increase imaging speed.

The invention also comprises a method of using the thermal development apparatus of the invention comprising the steps of:

a) heating the at least one heatable roll;

b) causing contact between the at least one heated roll and the imaged surface of the flexographic printing element; and c) rotating the at least one heated roll against at least a portion of the imaged surface of the flexographic printing element to melt and remove non-crosslinked photopolymer from the imaged surface of the flexographic printing element.

DETAILED DESCRIPTION OF THE PREFERRED EMBODIMENTS OF THE INVENTION

Figure 1:
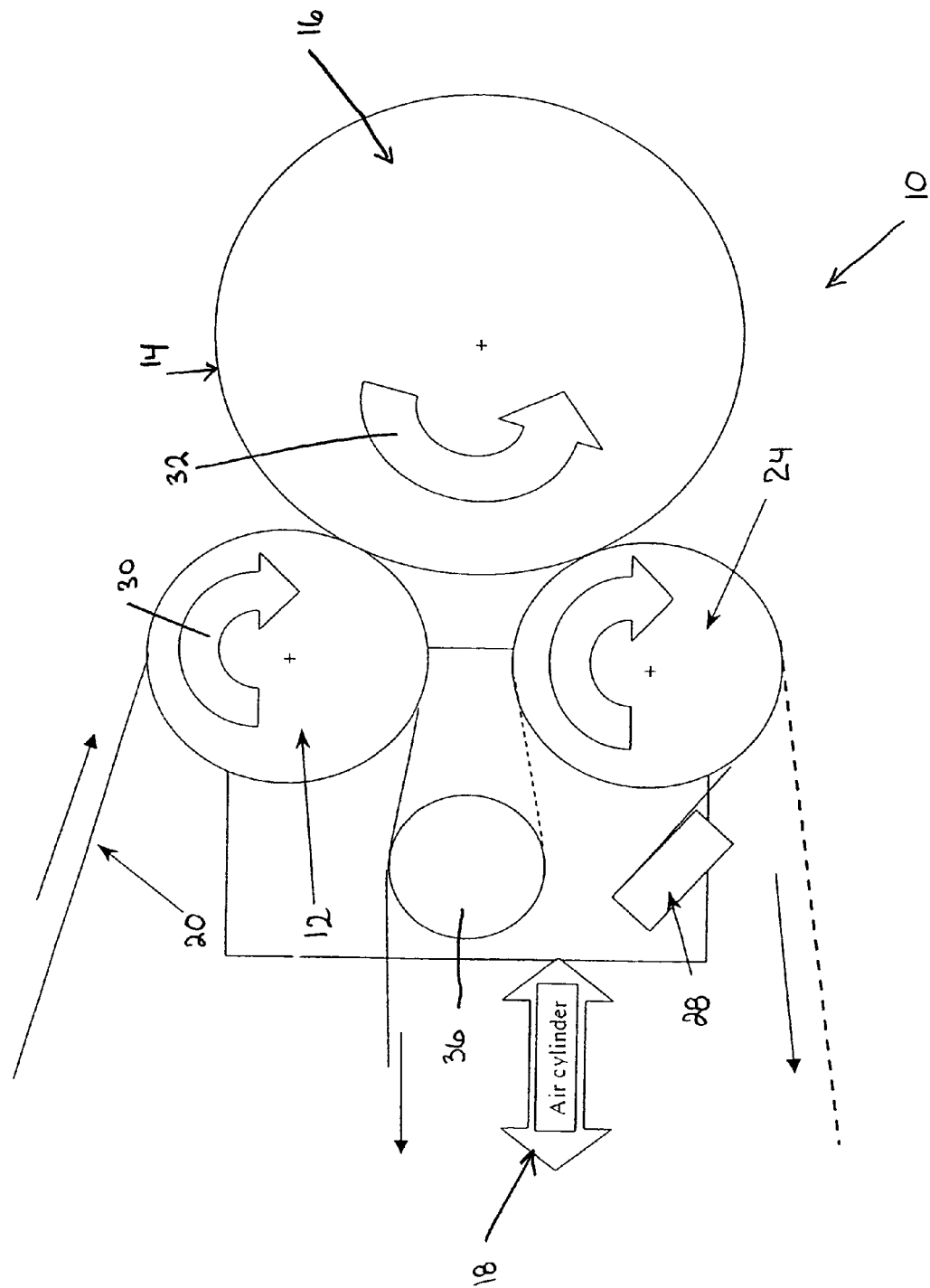
FIG. 1 depicts one embodiment of the thermal development apparatus of the instant invention.
Figure 2:
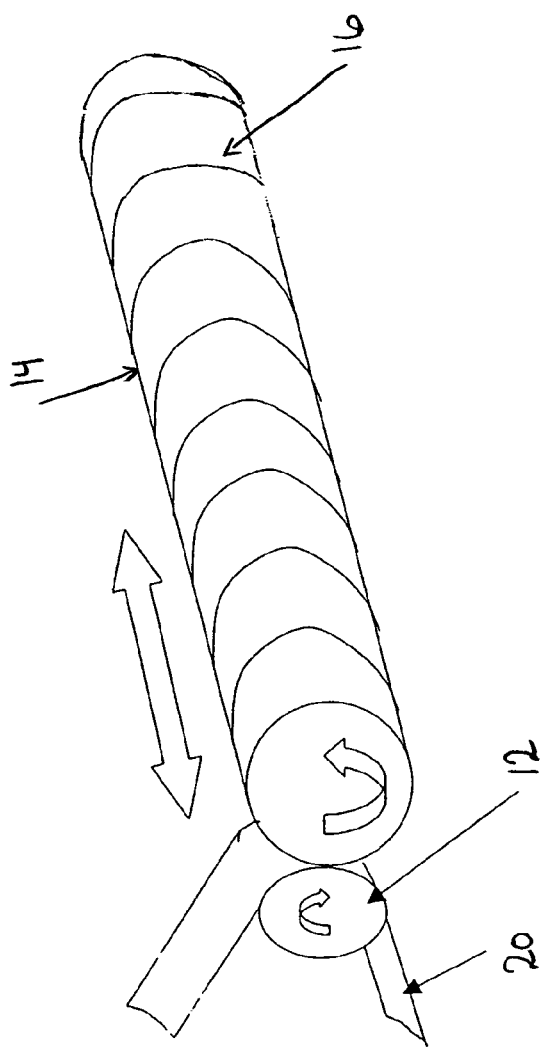
FIG. 2 depicts a different view of the thermal development apparatus of the invention and shows the motion of the heated roll traversing the length of the cylindrical printing element.

The present invention relates to an improved thermal development apparatus and a method of using the apparatus to remove non-crosslinked polymer from an imaged surface of a relief image printing element during a process for manufacturing the relief image printing element.

A flexographic printing element is produced from a photocurable printing blank by imaging the photocurable printing blank to produce a relief image on the surface of the printing element. This is generally accomplished by selectively exposing the photocurable material to actinic radiation, which exposure acts to harden or crosslink the photocurable material in the irradiated areas.

The photocurable printing blank contains one or more layers of an uncured photocurable material on a suitable backing layer. The photocurable printing blank can be in the form of either a flat, planar element or as a cylindrical printing element.

The printing element is selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer, which is also sensitive to laser ablation. A laser is then used to ablate selected areas of the actinic radiation opaque layer creating an in situ negative. The printing element is then flood exposed through the in situ negative. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Once the photopolymer layer of the printing element has been selectively exposed to actinic radiation, it is developed using the novel thermal developing apparatus of the instant invention to remove uncured portions of the photopolymer, without disturbing the cured portions of the photopolymer layer, to produce the relief image.

The novel thermal development apparatus of the invention typically comprises:

(i) means to support, and preferably rotate, a flexographic printing element;

(ii) at least one heatable roll that is contactable with an imaged surface of a flexographic printing element;

(iii) means for maintaining contact between the at least one heatable roll and the imaged surface of the flexographic printing element, and (iv) optionally, but preferably, means to supply a material which is capable of removing the softened or melted polymer from the flexographic printing element; wherein when the at least one heatable roll is heated and is moved over at least a portion of the imaged surface of the flexographic printing element, non-crosslinked polymer on the imaged surface of the flexographic printing element is melted and removed by the at least one heatable roll.

As seen in FIG. 1, the thermal developing apparatus (10) of the invention comprises at least one heatable roll (12) that is contactable with an imaged surface (14) of a flexographic printing element (16) and a means (18) for maintaining contact between the at least one heatable roll (12) and the imaged surface (14) of the flexographic printing element (16). When the at least one heatable roll (12) is heated and is moved over at least a portion of the imaged surface (14) of the flexographic printing element (16), non-crosslinked polymer on the imaged surface (14) of the flexographic printing element (16) is melted and removed by the at least one heatable roll (12).

The at least one heatable roll generally has a length of about 4 to about 12 inches, and a diameter of about 4 to about 6 inches, although the invention is not limited heatable rolls of a particular size or diameter. A skilled artisan would be able to determine a suitable length and diameter for a heatable roll that would be usable in the thermal developing apparatus of the invention.

In a preferred embodiment, the thermal developing apparatus comprises two heatable rolls (12) and (24) that are opposably positionable adjacent and apart from each other and are each maintainable in contact with the imaged surface (14) of the flexographic printing element (16). When the two heatable rolls (12) and (24) are contacted with the imaged surface (14) of the flexographic printing element (16), the two heatable rolls (12) and (24) are self-centering against the imaged surface (14) of the flexographic printing element (16).

The means (18) for maintaining contact between the at least one heatable roll (12) and the imaged surface (14) of the flexographic printing element (16) typically comprises an air cylinder or a hydraulic cylinder that acts to force the at least one heatable roll (12) against the imaged surface (14) of the flexographic printing element (16). Other means for maintaining the contact between the at least one heatable roll (12) and the flexographic printing element (16) would also be known to one skilled in the art.

Although the flexographic printing element (16) of the invention is depicted as being a cylindrical flexographic printing element, i.e., a printing sleeve, the invention is not limited to cylindrical flexographic printing elements and would also be usable for removing non-crosslinked polymer from the imaged surface of a flat flexographic printing element. The flat flexographic printing element may be used as a printing plate or may be wrapped around a cylindrical shaft and used as a cylindrical printing element.

In one embodiment, the thermal developing apparatus of the invention has a blotting material (20) positioned on at least a portion of the at least one heatable roll (12). Thus, when the at least one heatable roll (12) is heated and is contacted with the imaged surface (14) of the flexographic printing element (16), non-crosslinked polymer on the imaged surface (14) of the flexographic printing element (16) is melted by the heated roll (12) and is removed by the blotting material (20).

The blotting material (20) is typically looped under and around at least the portion of the at least one heatable roll (12) that contacts the imaged surface (14) of the flexographic printing element (16). The blotting material (20) is continuously supplied to the at least one heatable roll (12) from a remote source (not shown) of the blotting material (20). The thermal developing apparatus further comprises a rewind device (not shown) to carry away the blotting material (20) that contains the removed non-crosslinked polymer.

In a preferred embodiment, the blotting material comprises paper or woven or non-woven fabrics. Blotting materials that are usable in the invention include screen mesh and absorbent fabrics, including polymer-based and non-polymer-based fabrics.

In an alternate embodiment, the thermal developing apparatus comprises a doctor blade (28) that is positionable adjacent to the at least one heatable roll (12) or (24), which is shown positioned adjacent to the second heatable roll (24). When the at least one heatable roll (24) removes non-crosslinked polymer from the imaged surface (14) of the flexographic printing element (16), the doctor blade (28) wipes the non-crosslinked polymer from the surface of the at least one heatable roll (24).

The thermal developing apparatus of the invention removes non-crosslinked polymer from the imaged surface (14) of the flexographic printing element by rotating the at least one heatable roll (12) over at least a portion of the imaged surface (14) of the flexographic printing element (16). Preferably, the at least one heatable roll (12) rotates in a first direction (30) and the cylindrical flexographic printing element (16) rotates in an opposite direction (32) from the at least one heatable roll (12).

The thermal developing apparatus of the invention also comprises means (not shown) for allowing the at least one heatable roll to traverse along the length of the cylindrical flexographic printing element. The advantage to this design feature is that movement of the heated roll across the surface of the printing element allows the improved thermal developing apparatus of the invention to accommodate printing elements of various lengths and diameters. In this case, the at least one heatable roll rotates along the length or around the circumference of the printing element and also moves in a direction parallel to the axis of rotation along the width of the printing element.

The blotting material (20) may be continuously fed to the two heatable rolls (12) and (24) by looping the blotting material (20) under and around at least the portion of the first heatable roll (12) that is contactable with the imaged surface (14) of the flexographic printing element (16), looping the blotting material (20) around one or more track rolls (36) positioned between the two heatable rolls (12) and (24), and then looping the blotting material (20) under and around at least the portion of the second heatable roll (24) that is contactable with the imaged surface (14) of the flexographic printing element (16).

Figure 3:
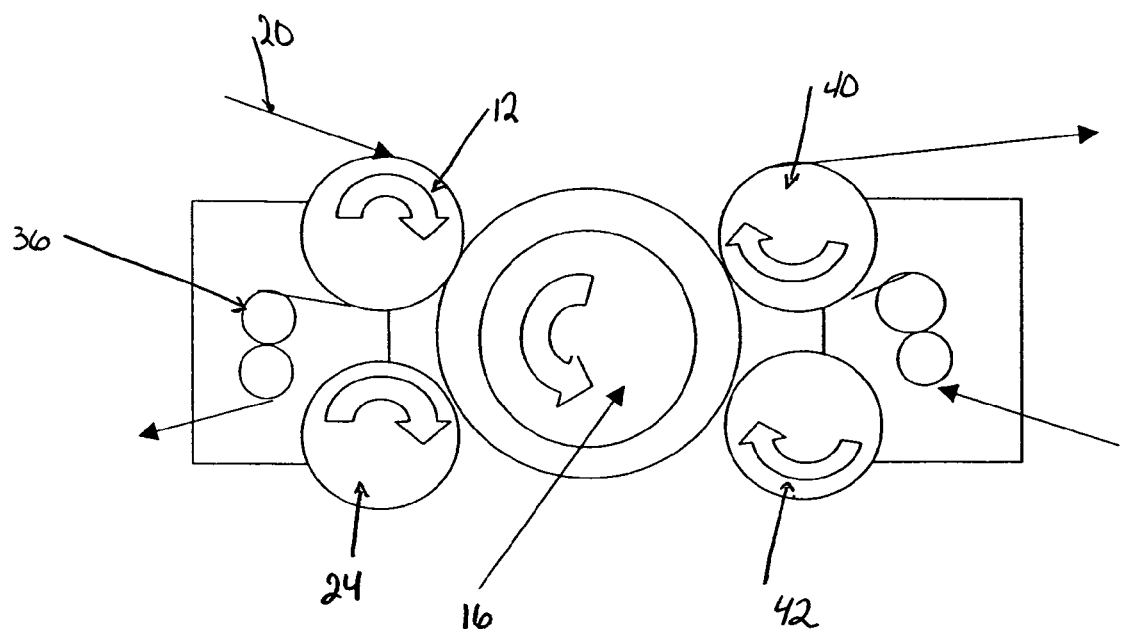
FIG. 3 depicts another embodiment of the thermal development apparatus of the instant invention wherein opposing heads are used to improve imaging speed and eliminate roll bending and machine stiffness design problems.

As best shown in FIG. 3, the thermal developing apparatus of the invention may further comprise one or more additional heatable rolls (40) and (42) that are positionable in an opposing position on an opposite side of the cylindrical flexographic printing element (16). The one or more additional heatable rolls (40) and (42) are maintainable in contact with at least a portion of the imaged surface (14) of the flexographic printing element (16). When the one or more additional heatable rolls (40) and (42) are contacted with the imaged surface (14) of the flexographic printing element (16), removal of resin from the imaged surface (14) of the flexographic printing element (16) as well as the imaging speed can be increased. Use of the two additional heatable rolls (40) and (42) may also eliminate roll bending and machine stiffness design problems, which can cause uneven floors in large flat plate machines. Also, since the high forces required to push the blotter into the resin oppose each other, the improved design features of the invention allow for the use of much lighter materials (i.e., fiberglass instead of steel support shafts) to support the printing sleeve while it is being processed.

The present invention also involves a method of removing non-crosslinked polymer from an imaged surface of a flexographic printing element with at least one heatable roll, the method comprising:

a) heating the at least one heatable roll;

b) causing contact between the at least one heated roll and the imaged surface of the flexographic printing element; and c) rotating the at least one heated roll against at least a portion of the imaged surface of the flexographic printing element to melt and remove non-crosslinked photopolymer from the imaged surface of the flexographic printing element.

The at least one heated roll can traverse the length of the cylindrical flexographic printing element in a spiral or stepwise manner. In a preferred embodiment, the at least one heated roll traverses the length of the flexographic printing element one or multiple times until all of the non-crosslinked polymer is removed from the imaged surface of the flexographic printing element. The heated roll can also be angled such that its axis of rotation is not parallel with the axis of rotation of the flexographic printing element, and can be transverse to the axis of rotation of the flexographic printing element.

The at least one heated roll is typically maintained at a temperature that is between the melt temperature of the uncured photopolymer on the low end and the melt temperature of the cured photopolymer on the upper end. This will allow selective removal of the photopolymer thereby creating the image. Preferably the at least one heated roll is maintained at a temperature of about 350° F. to about 450° F. The addition of external heating source(s) such as infrared heaters or hot air can be introduced prior to the contact point between the heatable roll(s) and the flexographic printing element to improvise the efficiency of the softening/melting of the non-crosslinked polymer.

What is claimed is:

1. A thermal developing apparatus for removing non-crosslinked polymer from an imaged surface of a cylindrical flexographic printing element, the thermal developing apparatus comprising:

at least two heatable rolls that are contactable with an imaged surface of the flexographic printing element; and means for maintaining contact between the at least two heatable rolls and the imaged surface of the flexographic printing element, wherein when the at least two heatable rolls are heated and moved over at least a portion of the imaged surface of the flexographic printing element, non-crosslinked polymer on the imaged surface of the flexographic printing element is melted and removed by the at least two heatable rolls, and wherein the at least two heatable rolls are opposably positioned adjacent and apart from each other and are each maintainable in contact with the imaged surface of the flexographic printing element, and wherein when the at least two heatable rolls are contacted with the imaged surface of the flexographic printing element, the at least two heatable rolls are self centering against the imaged surface of the flexographic printing element.

2. The thermal developing apparatus according to claim 1, wherein a blotting material is positioned on at least a portion of the at least two heatable rolls, and wherein when the at least two heatable rolls are heated and are contacted with the imaged surface of the flexographic printing element, non-crosslinked polymer an the imaged surface of the flexographic printing element is melted by the heated rolls and is removed by the blotting material.

3. The thermal developing apparatus according to claim 2, wherein the blotting material is looped under and around at least the portion of the at least two heatable rolls that contact the imaged surface of the flexographic printing element.

4. The thermal developing apparatus according to claim 3, wherein the blotting material is continuously supplied to the at least two heatable rolls from a remote source of the blotting material.

5. The thermal developing apparatus according to claim 3, further comprising a rewind device to carry away the blotting material that contains the removed non-crosslinked polymer.

6. The thermal developing apparatus according to claim 2, wherein the blotting material is paper.

7. The thermal developing apparatus according to claim 1, further comprising a doctor blade that is positionable adjacent to at least one of the two heatable rolls, and wherein when the at least one heatable roll removes non-crosslinked polymer from the imaged surface of the flexographic printing element, the doctor blade wipes the non-crosslinked polymer from the surface of the at least one heatable roll.

8. The thermal developing apparatus according to claim 1, wherein the means for maintaining contact between the at least two heatable rolls and the imaged surface of the flexographic printing element comprises an air cylinder or a hydraulic cylinder that forces the at least two heatable rolls against the imaged surface of the flexographic printing element.

9. The thermal developing apparatus according to claim 1, wherein the at least two heatable rolls rotate in a first direction and the cylindrical flexographic printing element rotates in an opposite direction from the at least two heatable rolls.

10. The thermal developing apparatus according to claim 1, further comprising means for allowing the at least two heatable rolls to traverse along the length of the cylindrical flexographic printing element.

11. The thermal developing apparatus according to claim 1, wherein a blotting material is continuously fed to the at least two heatable rolls by looping the blotting material under and around at least the portion of the first heatable roll that is contactable with the imaged surface of the flexographic printing element, looping the blotting material around one or more track rolls positioned apart from the two heatable rolls, and then looping the blotting material under and around at least the portion of the second heatable roll that is contactable with the imaged surface of the flexographic printing element.

12. The thermal developing apparatus according to claim 1, further comprising one or more additional heatable rolls that are positionable in an opposing position on an opposite side of the flexographic printing element, wherein the one or more additional heatable rolls are maintainable in contact with at least a portion of the imaged surface of the flexographic printing element.

13. A method of removing non-crosslinked polymer from an imaged surface of a cylindrical flexographic printing element with at least two heatable rolls, the method comprising:
  a) heating the at least one two heatable rolls;
  b) causing contact between the at least two heated rolls and the imaged surface of the flexographic printing element; and
  c) rotating the at least two heated rolls against at least a portion of the imaged surface of the flexographic printing element to melt and remove non-crosslinked photopolymer from the imaged surface of the flexographic printing element; wherein the at least two heatable rolls are opposably positioned adjacent and apart from each other and are each maintained in contact with the imaged surface of the flexographic printing element and wherein when the at least two heatable rolls are contacted with the imaged surface of the flexographic printing element, the at least two heatable rolls are self centering against the imaged surface of the flexographic printing element.

14. The method according to claim 13, wherein the at least one heated rolls traverse the length of the flexographic printing element.

15. The method according to claim 14, wherein the at least two heated rolls traverse the length of the flexographic printing element multiple times until all of the non-crosslinked polymer is removed from the imaged surface of the flexographic printing element.

16. The method according to claim 14, wherein the at least two heated rolls traverse the length of the flexographic printing element in a spiral or stepwise manner.

17. The method according to claim 13, wherein the at least two heated rolls rotate in a first direction and the flexographic printing element rotates in an opposite direction from the at least two heated rolls.

18. The method according to claim 13, wherein an air cylinder or a hydraulic cylinder is used to maintain contact between the at least two heated rolls and the imaged surface of the flexographic printing element.

19. The method according to claim 13, wherein at least the portion of the at least two heated rolls that are in contact with the imaged surface of the flexographic printing element is covered with a blotting material and the blotting material removes the non-crosslinked polymer from the imaged surface of the flexographic printing element.

20. The method according to claim 19, wherein the blotting material is looped under and around at the least the portion of the at least two heated rolls that are in contact with the imaged surface of the flexographic printing element.

21. The method according to claim 20, wherein the blotting material is continuously fed to the at least two heated rolls from a remote source of the blotting material.

22. The method according to claim 21, wherein the blotting material that contains the removed non-crosslinked photopolymer is rewound onto a rewind device.

23. The method according to claim 19, wherein the blotting material comprises paper.

24. The method according to claim 13, wherein the non-crosslinked polymer remaining on the at least two heated rolls after removal from the imaged surface of the flexographic printing element is removed from the at least two heated rolls by positioning a doctor blade adjacent to the at least one of the two heated rolls to wipe the non-crosslinked polymer from the surface thereof.

25. The method according to claim 13, wherein the blotting material is continuously fed to the at least two heated rolls by wrapping blotting material around at least the portion of the first heated roll that is in contact with the imaged surface of the flexographic printing element, looping the blotting material around one or more track rolls positioned apart from the at least two heated rolls, and then wrapping the blotting material around at least the portion of the second heated roll that is in contact with the imaged surface of the flexographic printing element.

26. The method according to claim 13, wherein one or more additional heated rolls are positioned in an opposing position on an opposite side of the cylindrical flexographic printing element and maintained in contact with at least a portion of the imaged surface of the flexographic printing element.

27. The method according to claim 13, wherein the at least two heated rolls are maintained at a temperature of about 350° F. to about 450° F.

28. A thermal developing apparatus for removing non-crosslinked polymer from an imaged surface of a flexographic printing element, the thermal developing apparatus comprising:
(a) at least two heatable rolls that are contactable with the imaged surface of the flexographic printing element; and
(b) means for maintaining contact between the at least two heatable rolls and the imaged surface of the flexographic printing element;
wherein when the at least two heatable rolls are heated and moved over at least a portion of the imaged surface of the flexographic printing element, non-crosslinked polymer on the imaged surface of the flexographic printing element is melted and removed and wherein at least two heatable rolls are positioned opposing each other on opposite sides.

29. A method of removing non-crosslinked polymer from an imaged surface of a flexographic printing element with at least two heatable rolls, the method comprising:
(a) heating the at least two heatable rolls;
(b) causing contact between the at least two heatable rolls and the imaged surface of the flexographic printing element; and
(c) rotating the at least two heatable rolls against at least a portion of the imaged surface of the flexographic printing element to melt and remove non-crosslinked polymer from the imaged surface of the flexographic printing element;
wherein the at least two heatable rolls are positioned opposing each other on opposite sides.

30. A method according to claim 29 wherein the at least two heatable rolls traverse the length of the flexographic printing element.

31. A method according to claim 30 wherein the at least two heatable rolls traverse the length of the flexographic printing element in a spiral or stepwise manner.

32. A thermal developing apparatus for removing non-crosslinked polymer from an imaged surface of a flexographic printing element, the thermal developing apparatus comprising;
(a) at least two heatable rolls that are contactable with the imaged surface of the flexographic printing element
(b) means for maintaining contact between the at least two heatable rolls and the imaged surface of the flexographic printing element; and
(c) a means for continuously supplying blotting material to the at least two heatable rolls by wrapping the blotting material around at least a portion of the first heatable roll, looping the blotting material around one or more track rolls positioned apart from the at least two heatable rolls, and then wrapping the blotting material around at least a portion of the second heatable roll.
wherein when the at least two heatable rolls are heated and moved over at least a portion of the imaged surface of the flexographic printing element, non-crosslinked polymer on the surface of the flexographic printing element is melted and removed.

33. A method of removing non-crosslinked polymer from an imaged surface of a flexographic printing element with at least two heatable rolls, the method comprising:
(a) heating the at least two heatable rolls;
(b) continuously supplying blotting material to the at least two heatable rolls by wrapping the blotting material around at least a portion of the first heatable roll, looping the blotting material around one or more track rolls positioned apart from the at least two heatable rolls, and then wrapping the blotting material around at least a portion of the second heatable roll;
(c) causing contact between the at least two heatable rolls and the imaged surface of the flexographic printing element; and
(d) rotating the at least two heatable rolls against at least a portion of the imaged surface of the flexographic printing element to melt and remove non-crosslinked polymer from the imaged surface of the flexographic printing element.

34. A thermal developing apparatus for removing non-crosslinked polymer from an imaged surface of a flexographic printing element, the thermal developing apparatus comprising:
(a) at least one heatable roll that is contactable with the imaged surface of the flexographic printing element;
(b) means for causing the at least one heatable roll to transverse the imaged surface of the flexographic printing element in a spiral or stepwise manner;
(c) means for maintaining contact between the at least one heatable roll and the imaged surface of the flexographic printing element;
wherein when the at least one heatable roll is heated and moved over at least a portion of the imaged surface of the flexographic printing element, non-crosslinked polymer on the surface of the flexographic printing element is melted and removed.

35. An apparatus according to claim 34 also comprising a means for supplying blotter material to the at least one heatable roll such that the blotter material passes between the at least one heatable roll and the imaged surface of the flexographic printing element.

36. A method of removing non-crosslinked polymer from an imaged surface of a flexographic printing element, said method comprising:
(a) heating at least one heatable roll;
(b) causing contact between the at least two heatable rolls and the imaged surface of the flexographic printing element;
(c) causing the at least one heatable roll to traverse the imaged surface of the flexographic printing element in a spiral or stepwise manner;
wherein non-crosslinked polymer is removed from the imaged surface of the flexographic printing element.

37. A method according to claim 36 wherein the method further comprises supplying blotting material to the at least one heatable roll such that the blotting material passes between the at least one heatable roll and the imaged surface of the flexographic printing element.

* * * * *

UNITED STATES PATENT AND TRADEMARK OFFICE
CERTIFICATE OF CORRECTION

PATENT NO.    : 6,998,218 B2
DATED         : February 14, 2006
INVENTOR(S)   : Gary T. Markhart It is certified that error appears in the above-identified patent and that said Letters Patent is hereby corrected as shown below:

Column 8,
Line 61, delete "polymer an the" and replace with -- polymer on the --.

Column 9,
Line 56, between "least" and "two" delete "one".

Signed and Sealed this

Second Day of May, 2006

JON W. DUDAS
*Director of the United States Patent and Trademark Office*